United States Patent [19]

Kagaya et al.

[11] Patent Number: 5,739,559
[45] Date of Patent: Apr. 14, 1998

[54] COMPOUND SEMICONDUCTOR INTEGRATED CIRCUIT WITH A PARTICULAR HIGH RESISTANCE LAYER

[75] Inventors: Osamu Kagaya, Hachiouji; Hiroyuki Takazawa, Hino, both of Japan

[73] Assignee: Hitachi, Ltd., Tokyo, Japan

[21] Appl. No.: 798,450

[22] Filed: Feb. 10, 1997

Related U.S. Application Data

[63] Continuation of Ser. No. 403,986, Mar. 15, 1995, abandoned.

[30] Foreign Application Priority Data

Mar. 17, 1994 [JP] Japan .................. 6-046719

[51] Int. Cl.⁶ .................. H01L 31/0328; H01L 31/0336; H01L 29/167
[52] U.S. Cl. .................. 257/192; 257/194; 257/612
[58] Field of Search .................. 257/192, 194, 257/610, 611, 612

[56] References Cited

U.S. PATENT DOCUMENTS 5,172,197 12/1992 Nguyen et al. .................. 257/194
5,276,340 1/1994 Yokohama et al. .................. 257/194
5,293,084 3/1994 Itoh et al. .................. 257/195

FOREIGN PATENT DOCUMENTS

| 2-49465A | 2/1990 | Japan . |
| 3-87044A | 4/1991 | Japan . |
| 5-275474 | 10/1993 | Japan . |
| 5-275474A | 10/1993 | Japan . |
| 5-283439 | 10/1993 | Japan . |
| 5-283439A | 10/1993 | Japan . |
| 5-283517A | 10/1993 | Japan . |

OTHER PUBLICATIONS

IEEE Transactions on Electron Devices, vol. ED-34, No. 6, Jun. 1987 Mechanisms for Low-Frequency Oscillations in GaAs FET's, pp. 1239-1244.

Primary Examiner—Wael Fahmy
Attorney, Agent, or Firm—Kenyon & Kenyon

[57] ABSTRACT

A compound semiconductor integrated circuit having a high resistance layer consisting of a compound semiconductor to which oxygen is added as an impurity and an undoped compound semiconductor layer which are formed between a semi-insulating substrate and field effect transistors formed thereon sequentially from the semi-insulating substrate side is suited to a superspeed operation because the low frequency oscillation is suppressed.

12 Claims, 6 Drawing Sheets

FIG. 1
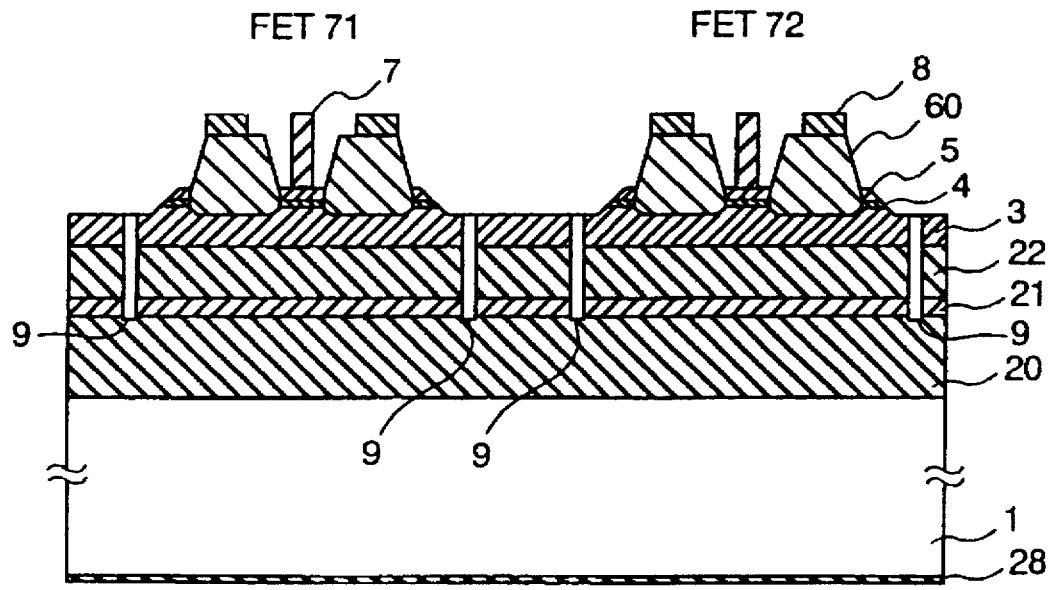
FIG. 2  *PRIOR ART*
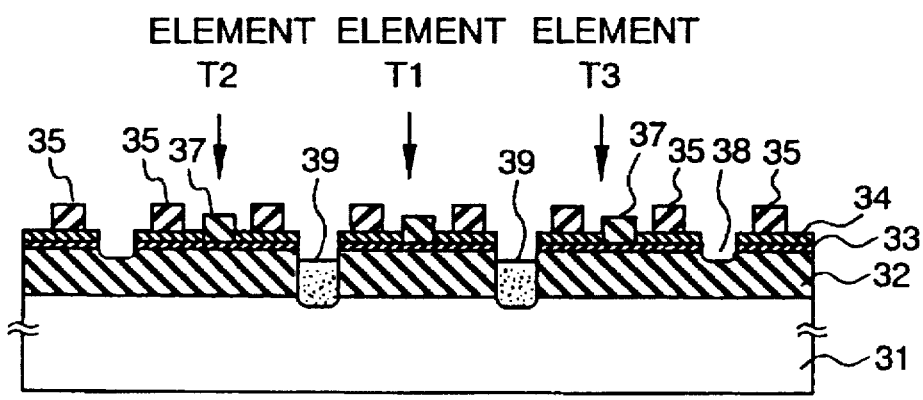

COMPOUND SEMICONDUCTOR INTEGRATED CIRCUIT WITH A PARTICULAR HIGH RESISTANCE LAYER

This application is a continuation of Ser. No. 08/403,986 filed on Mar. 15, 1995, now abandoned.

BACKGROUND OF THE INVENTION

The present invention relates to a compound semiconductor integrated circuit using field effect transistors (FET) and more particularly to a compound semiconductor transistor having an element structure which is most suited to suppress the phenomenon of low frequency oscillation thereof.

A conventional compound semiconductor integrated circuit (prior art 1) using field effect transistors (FET) is discussed in, for example, IEEE Transactions On Electron Devices, Vol. ED-34, No. 6, 1987, pp. 1239–1244). The compound semiconductor integrated circuit, as shown in FIG. 10, electrically separates the GaAs MESFETs (metal semiconductor field effect transistors) by forming an etched region 207 for separating the elements between them. In FIG. 10, a numeral 201 indicates a semi-insulating GaAs substrate, 202 an n type GaAs active layer, 203 a high concentration n type GaAs contact layer, 204 an ohmic electrode, 205 a gate electrode, 206 a gate electrode pad, and 208 a backside substrate electrode.

A compound semiconductor integrated circuit (prior art 2) using another element separating method is discussed in, for example, Japanese Patent Application Laid-Open 2-49465. The compound semiconductor integrated circuit, as shown in FIG. 2, has an undoped GaAs layer 32 of 500 nm in thickness under GaAs FETs (HEMT) T1, T2, and T3. This compound semiconductor integrated circuit has nonactive zones 39 which are formed by implanting oxygen ions between the FETs T1, T2, and T3, so that the FETs are electrically separated from each other, and particularly the sidegate effect is reduced, and the characteristics of the integrated circuit have been improved. The sidegate effect is a phenomenon that the current flowing through the field effect transistors is decreased and the threshold voltage is changed by the electric interaction between the elements. In FIG. 2, a numeral 31 indicates a semi-insulating GaAs layer, 33 an electron supply layer consisting of an n type AlGaAs layer, 34 a contact layer consisting of an n type GaAs layer, 35 an ohmic electrode, 37 a gate electrode, and 38 an element separating zone which is an etched region.

A compound semiconductor integrated circuit (prior art 3) using another element separating method is discussed in, for example, Japanese Patent Application Laid-Open 3-87044. The compound semiconductor integrated circuit, as shown in FIG. 3, has a hetero junction buffer layer 42 consisting of an undoped AlGaAs layer 100 nm in thickness under the GaAs FET and an etched region 46 for separating the elements which reaches a hetero junction interface 44 between the above buffer layer 42 and the neighboring FET, so that the electrical separation of the FETs and particularly the sidegate effect are improved furthermore. In FIG. 3, a numeral 41 indicates a semi-insulating substrate, 43 an undoped GaAs layer, 45 an ohmic electrode, 47 and 48 ohmic electrodes, and 49 a gate electrode.

When an amplifier circuit with a high gain consists of compound semiconductor FETs, it is necessary to suppress the sidegate effect and also to suppress a phenomenon referred to as low frequency oscillation. This phenomenon of low frequency oscillation is a phenomenon that even when there is no input signal, the current flowing through the FETs of the integrated circuit self-oscillates stationarily and it is called a "low frequency oscillation" because the frequency thereof is very low such as several Hz at room temperature.

In the aforementioned prior art (1 to 3), the suppression effect for the low frequency oscillation is not perfect and an abnormal operation is performed in these integrated circuits.

Particularly in the aforementioned prior art 1, a mechanism analysis of low frequency oscillation is executed and the following results are obtained. Firstly, when a negative (DC) voltage is applied to the element of the substrate surface measured from the backside substrate electrode and the electric field in the substrate reaches a certain value, the current flowing between the elements of the backside and surface of the substrate starts oscillation at a low frequency such as 0.4 to 5 Hz. When a semi-insulating GaAs substrate 600 μm in thickness is used, the current is about several nA and the oscillation amplitude is very small such as less than 1 nA. It is described that the electric field strength when this current oscillation starts to be generated is 200 V/cm. It is explained that the reason of occurrence of this phenomenon is that the semi-insulating GaAs substrate has a negative resistance due to a deep impurity level (for example, the degree of impurity level is EL2) and a high electric field domain travels from the element to the substrate electrode.

Furthermore, a compound semiconductor integrated circuit in which an isolated semiconductor layer or an electrode layer is installed on the semiconductor surface between the neighboring field effect transistors and also an element separating trench is installed so as to suppress the low frequency oscillation is indicated in Japanese Patent Application Laid-Open 5-275474. A semiconductor integrated circuit in which by using a constitution that an insulator is filled in an element separating trench in a specific shape, the elements can be separated from each other without the circuit wires being shorted is indicated in Japanese Patent Application Laid-Open 5-283517. It is indicated in Japanese Patent Application Laid-Open 5-283439 that in a semiconductor integrated circuit having a GaAs substrate and an n type GaAs active layer, by installing an undoped AlGaAs layer at least 150 nm in thickness under a p-type GaAs layer under the active layer and furthermore installing an element separating trench, the low frequency oscillation is suppressed.

In the specification and drawings of U.S. patent application Ser. No. 08/036787 which is pending at present, a compound semiconductor integrated circuit in which an isolated semiconductor layer or an electrode layer is installed on the semiconductor surface between the neighboring field effect transistors and also an element separating trench is installed so as to reduce the low frequency oscillation is indicated.

However, in any of the aforementioned prior art, a compound semiconductor integrated circuit in which by using a simple structure that a high resistance layer in which an impurity for forming a deep donor level is doped is installed between a semi-insulating substrate and a field effect transistor, the low frequency oscillation is suppressed as the present invention is not indicated.

SUMMARY OF THE INVENTION

The present invention provides an element structure which can suppress a low frequency oscillation and provides a compound semiconductor integrated circuit which is suited to a super-high speed operation.

The analysis of the inventors shows that according to the aforementioned prior art (1 to 3), the high electric field domain which travels between the elements (FET, diode, resistor electrode) and substrate electrode changes the potential of the lower part of the channel of the neighboring FET and greatly affects the drain current of the neighboring FET. For example, the oscillation amplitude which appears in the drain current of the FET with a gate width of 50 µm is at least 100 µA and a serious obstacle is caused to the circuit operation by this large current oscillation. As a result, for example, when a limit amplifier of a gain of 50 dB is formed, the low frequency oscillation generated in the integrated circuit is amplified and substandard amplifiers with a low frequency oscillation noise, which is large enough to saturate the output amplitude is generated, is often produced.

The above object of the present invention is accomplished by a compound semiconductor integrated circuit in which a high resistance layer to which a material for forming a deep donor level is added as an impurity and an undoped semiconductor layer are formed between the semi-insulating substrate and field effect transistor sequentially starting from the semi-insulating substrate side.

According to the present invention, every compound semiconductor integrated circuit having at least a plurality of field effect transistors on a semi-insulating substrate are improved and a high resistance layer and an undoped semiconductor layer are installed between the substrate and transistors as mentioned above, so that the low frequency oscillation is suppressed without any side effects.

An impurity which forms a deep donor level is oxygen O concretely when a compound semiconductor such as AlGaAs or InAlAs is used. It is desirable that the concentration of this impurity in the high resistance layer is at least $1 \times 10^{15}/cm^3$ and as the concentration increases, the effect of the present invention increases. However, the investigation of the inventors shows that when the concentration of impurity in the high resistance layer is controlled to $4 \times 10^{17}/cm^3$, a bad effect that the characteristic curve of each transistor is kinked occurs. Therefore, it is desirable to control the concentration of impurity to less than $4 \times 10^{17}/c^3$.

It is desirable that the sheet resistivity of the high resistance layer is high enough within the range that the device operation is not adversely affected, such as at least 10 kohm/square.

The matrix of the high resistance layer is a compound semiconductor and particularly a compound semiconductor having a composition that the lattice constant is close to the substrate crystal and no dislocation is generated by the lattice strain in the high resistance layer is generally desirable. For example, when a GaAs substrate is used, crystals of AlGaAs, InGaAs,InAlAs, and GaAs may be enumerated. Furthermore, for example, when an InP substrate is used, crystals of InGaAs, InAlAs, and InP may be enumerated. The enumerated crystals are binary and ternary compound semiconductors. However, needless to say, a quadruple or more compound semiconductor combining them may be used.

The thickness of a high resistance layer which is thick enough to suppress the low frequency oscillation depends on the transistor structure, particularly on the crystal structure of the active layer and of the region under it, so that the range thereof is not limited unconditionally. However, when, for example, 5 or 6 kinds of samples having high resistance layers which are different in thickness under the predetermined transistor structure are prepared and the suppression effect for low frequency oscillation is ascertained with each sample, the range of thickness of a high resistance layer which is most suitable for the transistor structure can be easily decided.

The matrices of the undoped semiconductor layer on a high resistance layer on the opposite side of the substrate are a compound semiconductor and particularly a compound semiconductor having a composition that the lattice constant is close to the high resistance layer and no dislocation is generated by the lattice strain is generally desirable.

In an undoped semiconductor layer, the concentration of an impurity having a deep impurity level is lower than the detection limit by the current measuring art and the concentration of a remaining impurity having a shallow impurity level is at most $1 \times 10^{16}/cm^3$.

To suppress the frequency dependent variation of output resistance, it is necessary that the thickness of an undoped semiconductor layer is at least about 200 nm. Although the thickness is not particularly limited, it is desirable to minimize the thickness as much as possible so as to decrease the manufacturing cost.

When an element separating trench is formed between the field effect transistors in addition to the aforementioned constitution in the present invention, better results can be obtained. The element separating trench produces a slight effect even when it is shallow. However, it is more desirable that the trench is deep so as to reach at least the aforementioned high resistance layer.

The inventors have studied suppressing an occurrence of a higher electronic field domain by forming a deep impurity level in the semiconductor layer under the element, and found that the electric field intensity under the element can be relaxed more than is done conventionally by forming (1) a deep electron trap level which will be a donor or (2) a deep hole trap level which will be a donor, and prevented an occurrence of a high electric field domain. The deep impurity level means an impurity level that has an energy difference $\Delta E$ from a valence band or conduction band in which no carriers are generated in a bulk crystal at the room temperature (300K) and in a stationary state and that exists in the forbidden band. The energy difference $\Delta E$ may be $\Delta E \geq 10$ kT=0.25 eV so as to control, for example, the carrier generation rate to at most $5 \times 10^{-5}$. The donor is an impurity which will be a positive space charge at the time of ionization and the accepter is an impurity which will be a negative space charge at the time of ionization. FIG. 4 shows the effect thereof. FIG. 4 shows results when the potential distribution under the field effect transistor is calculated by a two-dimensional device simulator. In the conventional case that the AlGaAs layer is an undoped layer, an electric field concentration is generated toward the surface by the two-dimensional effect and the electric field intensity under the FET is increased. In the present invention in which a deep donor level is formed in the AlGaAs layer, the electric field intensity under the FET is relaxed compared with the conventional. When the potential difference between the FET on the substrate surface and the backside substrate electrode is controlled to 7 V which is necessary for the IC operation, the maximum value of the electric field intensity becomes 180 V/cm and can be made lower than the intensity of critical electric field at which a high electric field domain is generated. As a structure of the compound semiconductor integrated circuit which is used to obtain the data shown in FIG. 4, the one shown in Embodiment 1 which will be described later and the one in which no impurity is doped in the high resistance layer 21 thereof are used.

When (3) a deep electron trap level which will be an accepter and (4) a deep hole trap level which will be an accepter are formed inversely to (1) and (2) mentioned above, the electric field intensity is increased up to 1300

V/cm, and a high electric field domain is easily generated, and a bad effect will be produced.

However, when a high resistance layer in which a deep impurity level is added to the semiconductor layer under the element is formed, a side effect that particularly the frequency dependent variation of output resistance of the FET characteristics becomes extraordinarily large is produced and the IC operation is adversely affected. This phenomenon is generated because the quasi-Fermi level crosses the deep impurity level in the high resistance layer under the FET. The inventors have studied a structure in which an undoped semiconductor layer is inserted between the under part of the FET and the high resistance layer and found that this undoped semiconductor layer is indispensable so as to keep the FET characteristics good. When the thickness of this undoped semiconductor layer is at least about 200 nm as shown in FIG. 5, the frequency dependent variation of output resistance can be suppressed sufficiently. The structure of the compound semiconductor integrated circuit which is used to obtain the data shown in FIG. 5 is the one shown in Embodiment 1, which will be described later, in which the thickness of the undoped semiconductor layer 22 thereof is changed to various values. The vertical axis shown in FIG. 5 indicates the ratio $r_{ds}$ (at DC)/$r_{ds}$ (at AC) of the output resistance (resistance between the source and drain regions) $r_{ds}$ (at DC) when the signal frequency is 0, that is, in the case of direct current to the output resistance (resistance between the source and drain regions) $r_{ds}$ (at AC) in the case of alternate current when the signal frequency is 1 MHz and it may be regarded as a signal frequency dependent variation of output resistance.

When a p type impurity semiconductor layer is formed under the FET, the FET characteristics can be improved and particularly the characteristics can be improved by suppressing the short cannel effect. However, in the case of without the undoped semiconductor layer, the p type impurity semiconductor layer raises the potential of the high resistance layer and the side effect of the aforementioned frequency dependent variation appears more strongly. Therefore, the existence of an undoped semiconductor layer is particularly important.

When a high resistance layer is formed in contact with a semi-insulating substrate, a high electric field domain is easily generated. It is considered that the reason is that a deep impurity level with a comparatively high electric field intensity exists on the semi-insulating substrate side of the interface between the high resistance layer and the semi-insulating substrate. One of the means for solving it is a means for forming an undoped buffer layer between the high resistance layer and the semi-insulating substrate and eliminating the deep impurity level under the high resistance layer. This undoped buffer layer is the same as a buffer layer which is used sometimes in a conventional compound semiconductor integrated circuit and the thickness thereof is generally at least about 300 nm.

BRIEF DESCRIPTION OF THE DRAWINGS

FIG. 1 is a cross sectional view showing the structure of a compound semiconductor integrated circuit according to an embodiment of the present invention.

FIG. 2 is a cross sectional view showing the structure of a compound semiconductor integrated circuit from the prior art.

DETAILED DESCRIPTION

Embodiment 1

Figure 3:
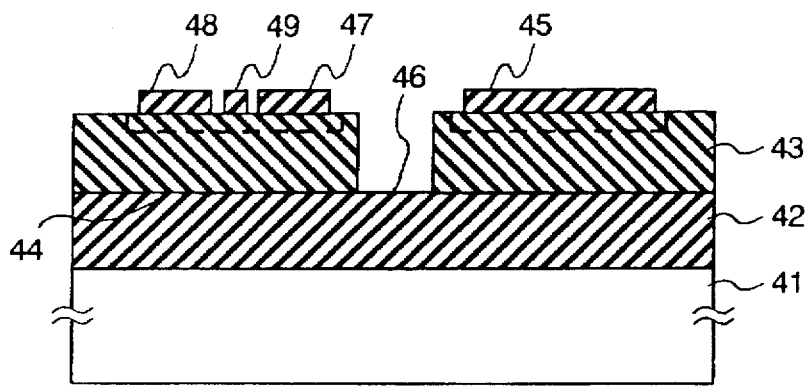
FIG. 3 is a cross sectional view showing the structure of another compound semiconductor integrated circuit from the prior art.
Figure 4:
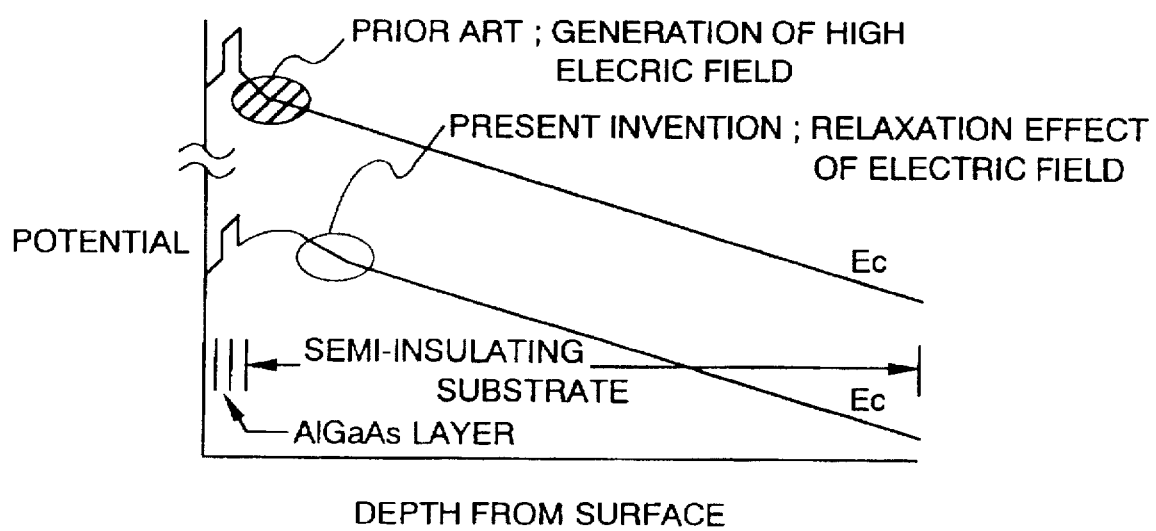
FIG. 4 is a potential distribution diagram under the field effect transistor showing the relaxation effect of electric field of a compound semiconductor integrated circuit of an embodiment of the present invention.
Figure 5:
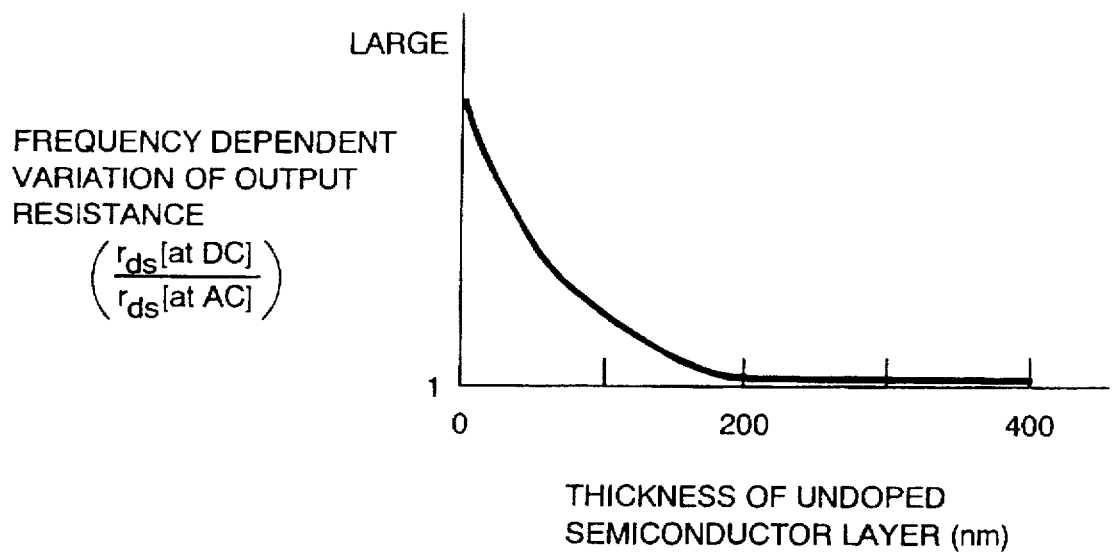
FIG. 5 is a graph showing the relationship between the frequency dependent variation of output resistance and the thickness of an undoped semiconductor layer of a compound semiconductor integrated circuit of an embodiment of the present invention.

Embodiment 1 of the present invention will be explained hereunder with reference to FIG. 1, FIGS. 6a to 6e, and FIG. 7. FIG. 1 is a cross section structural diagram of a type of FET which is called a HIGFET (heterostructure insulated-gate FET) and of the element separating structure, and FIGS. 6a to 6e are cross section structural diagrams showing the manufacturing process thereof, and FIG. 7 is a drawing showing the effect of Embodiment 1.

Firstly, the manufacturing process thereof will be explained. On a semi-insulating GaAs substrate 1 shown in FIG. 6a, an undoped GaAs buffer layer 20, a high resistance AlGaAs layer 21, an undoped GaAs layer 22, a p type GaAs layer 3, an n type GaAs active layer 4, and an undoped AlGaAs layer 5 are grown continuously and sequentially by the MBE (molecular beam epitaxy) method. As to the temperature of the substrate during growth, it is suitable to keep the layers 20 and 21 at 600° C., the layer 22 at 500° to 600° C., and the layers 3 to 5 at 500° C. The thickness and impurity concentration of each layer are as shown in Table 1. For the semi-insulating GaAs substrate 1, an undoped LEC (liquid-encapsulated Czochralski) substrate in which an impurity level of EL2 is formed in a concentration of about 1 to $3 \times 10^{16}$/cm$^3$ is generally used. However, a Cr doped LEC substrate (the Cr concentration is, for example, 1 to $3 \times 10^{16}$/cm$^3$) may be used. The composition ratio x of the undoped Al$_x$Ga$_{1-x}$As layer 5 is generally set to 0.3. The composition ratio x of the high resistance Al$_x$Ga$_{1-x}$As layer 21 is set to 0.1 to 0.3 and oxygen which will enter a deep donor level is used as an impurity. Oxygen in the high resistance layer is oxygen that is doped in the atmosphere of layer growth.

TABLE 1

| Layer name | Grown film thickness (nm) | Impurity concentration (1/cm$^3$) | Impurity |
|---|---|---|---|
| Undoped AlGaAs layer 5 | 13 | — | — |
| n type GaAs active layer 4 | 13 | $3.6 \times 10^{18}$ | Si |
| p type GaAs layer 3 | 300 | $3.0 \times 10^{16}$ | Be |
| Undoped GaAs layer 22 | 200 | — | — |
| High resistance AlGaAs layer 21 | 100 | $1.0 \times 10^{15}$ | O |
| Undoped GaAs buffer layer 20 | 300 | — | — |

Each layer shown in Table 1 may be formed by the MOCVD (metalorganic vapor phase deposition) method. In this case, it is suitable to use carbon as an impurity of the p type GaAs layer 3. The high resistance AlGaAs layer 21 may be replaced by a high resistance GaAs layer in which oxygen is doped.

Figure 6A:
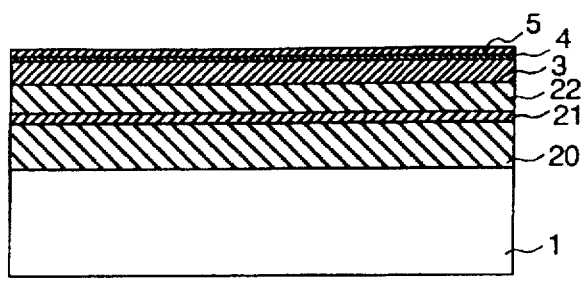
FIGS. 6a, 6b, 6c, 6d, and 6e are cross sectional views showing the manufacturing process of a compound semiconductor integrated circuit of an embodiment of the present invention.
Figure 6B:
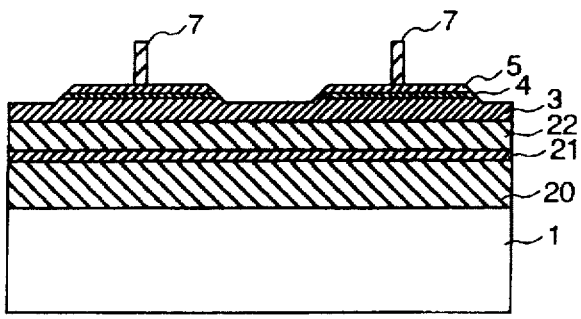
Figure 7:
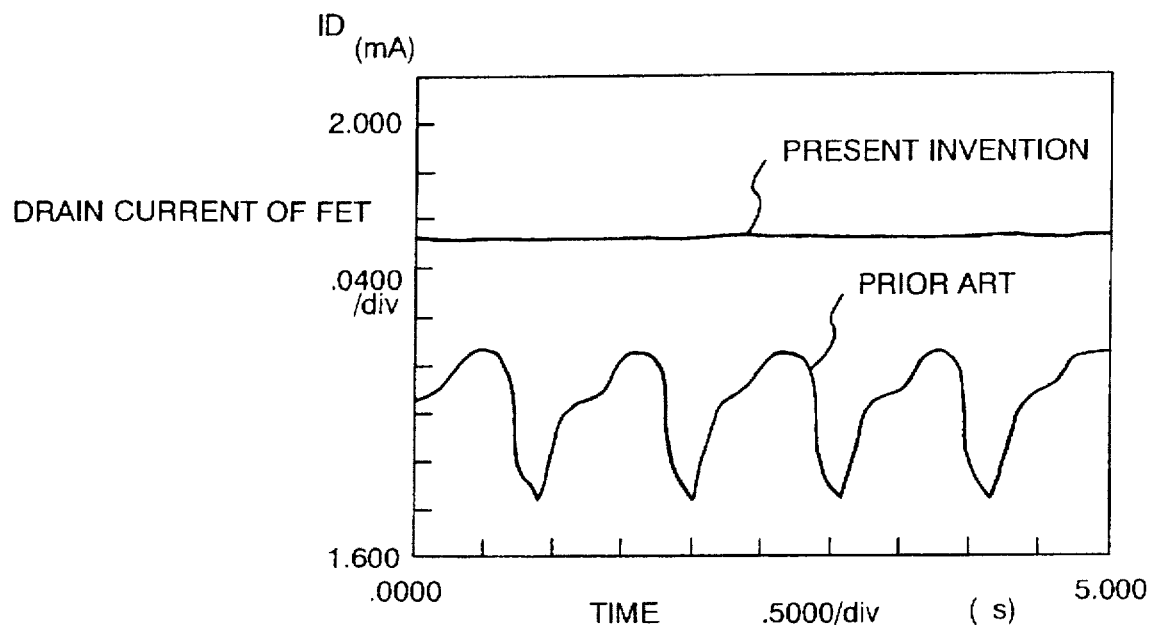
FIG. 7 is a graph showing the effect of a compound semiconductor integrated circuit of an embodiment of the present invention.

Next, in FIG. 6b, the region which will be an FET is covered with an SiO$^2$ film and the semiconductor surface in the other region is etched. The etching depth is 200 nm. Next, the SiO$^2$ film is removed and then a WSi$_x$ (tungsten silicide) film 600 nm in thickness is deposited by the sputtering method and subjected to the photolithography and dry etching process so as to form a refractory gate metal 7. It is suitable to set the composition ratio x of Si to 0.45. To minimize the resistance between the source and gate regions, Si ions may be implanted after the refractory gate metal 7 is formed. The ion implantation conditions in this case are that the acceleration energy is 50 keV and the dose is $1 \times 10^{14}$/cm$^2$ and the ions are activated by heat treatment at 750° C. for 5 minutes.

Figure 6C:
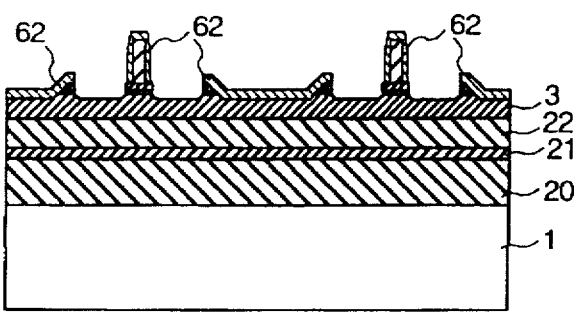

Next, in FIG. 6c, an SiON film 62 of 100 nm in thickness is deposited over the entire surface by the plasma CVD (chemical vapor deposition) method and the SiON film on the source and drain electrode part of the FET is etched by the photolithography and reactive ion etching method so as to form a window. As an etching gas, CF$_4$ and O$_2$ gases are generally used. Thereafter, the semiconductor surface is etched further to a depth of 70 nm by the reactive ion etching method so as to remove the undoped AlGaAs layer 5 on the part of the source and drain electrodes of the FET. In this case, the active layer 4 is also removed. SiCl$_4$ is used as an etching gas in this case.

Figure 6D:
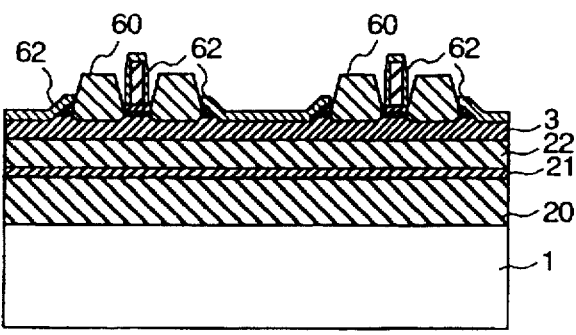

Next, in FIG. 6d, by using the SiON film 62 in which a window is formed as a mask, a heavily doped n type selectively growing layer 60 is grown by the MOCVD (metalorganic vapor phase deposition) method. This layer 60 consists of a GaAs layer 320 nm in thickness in which Si or Se is doped in a concentration of $4 \times 10^{18}$/cm$^3$. The temperature during growth is generally 700° C., and trimethylgallium and arsine are used as raw gases, and monosilane is used as a dopant gas.

Figure 6E:
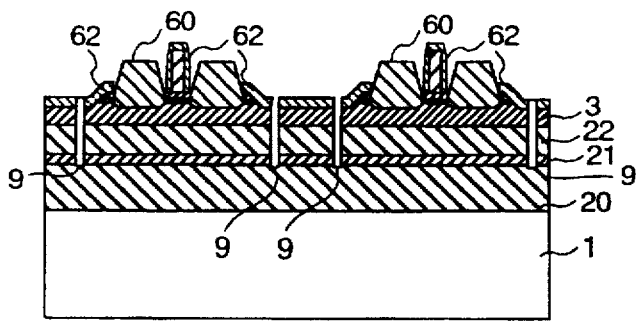

Next, in FIG. 6e, the SiON film 62, the p type GaAs layer 3, the undoped GaAs layer 22, and the high resistance AlGaAs layer 21 are etched by the photolithography and reactive ion etching method so as to form element separating trenches 9. Each of the element separating trenches 9 is 1 μm in width and 0.5 μm in depth and formed so as to enclose the periphery of each FET. When particularly the reactive ion etching method is used so as to process the element separating trenches 9 and the processing is executed under the condition that SiCl4 is used as an etching gas, and the microwave discharge power density is 1.54 kW/m$^2$, and the pressure is 44 mPa, even when trenches 0.5 μm in depth are formed, the side etching amount can be controlled to at most 0.2 μm and the element separating trenches 9 can be formed in a satisfactory shape.

Hereafter, when an ohmic electrode 8 is formed on the heavily doped n type selectively growing layer 60 by the lift-off method and furthermore a backside electrode 28 for ohmic connection is deposited on the backside of the semi-insulating GaAs substrate 1, field effect transistors 71 and 72 and the element separating structure as shown in FIG. 1 can be formed. Thereafter, when circuit wires are formed on the ohmic electrode 8 and the refractory gate metal 7, the integrated circuit is completed.

The effect of this embodiment will be explained with reference to FIG. 7. FIG. 7 is a graph showing the measured drain current of the neighboring FETs. The voltage of the backside substrate electrode is 0 V, and the source potential of one FET is −8 V, and the source potential of the target FET is −1 V, and the inter-FET interval is 10 μm. In the conventional FET structure, the drain current oscillates at an amplitude of at least 100 μA. However, it is shown in the drawing that in the FET structure of this Embodiment 1, the drain current shows a constant value and the low frequency oscillation is perfectly suppressed.

As mentioned above, according to this first embodiment, since the oscillation of a leakage current between the FETs and substrate is prevented, the low frequency oscillation of the drain current of the neighboring FETs can be suppressed. Furthermore according to this embodiment, the electrical separating effect between the FETs is satisfactory and the interval between the elements can be reduced to a very small value such as at most 10 μm, so that an integrated circuit in which the distortion of bandwidth due to the inductance L and capacity C of the circuit wires is low and the operation speed is very high can be realized. According to this embodiment, an AlGaAs layer which is easily bonded with oxygen is used as a high resistance layer, so that selectively mixing oxygen with a layer which will be a high resistance layer can be realized easily.

In this embodiment 1, the type of FETs is a HIGFET. However, an MESFET (metal-semiconductor field effect transistor) or an HEMT (high-electron mobility transistor) may also be used.

In this embodiment, it is also possible that the composition ratio of the high resistance Al$_x$Ga$_{1-x}$As layer 21 is set to 0.3 to 0.45 and silicone is used as an impurity instead of oxygen and doped in a concentration of $1 \times 10^{15}$/cm$^3$. In this case, the silicone forms a DX center which is on a deep donor level and the high electric field can be relaxed.

Embodiment 2

Figure 8:
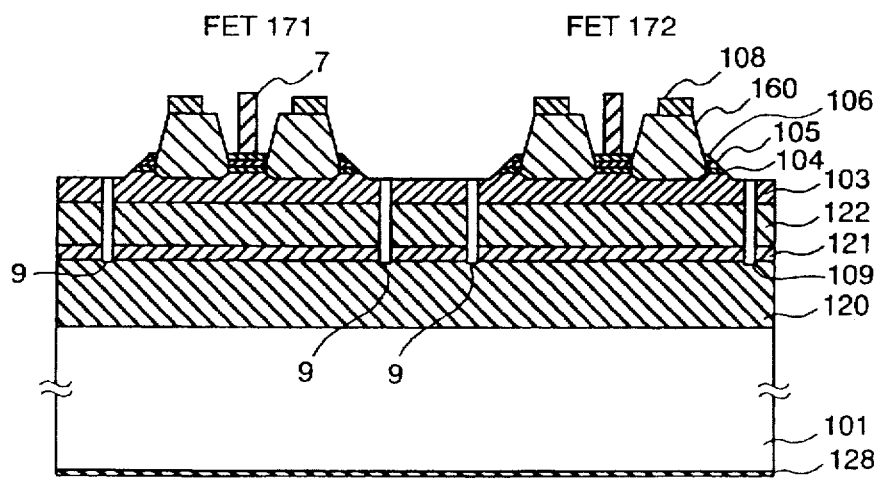
FIG. 8 is a cross sectional view showing the structure of a compound semiconductor integrated circuit according to another embodiment of the present invention.

Next, Embodiment 2 of the present invention will be explained with reference to FIG. 8. FIG. 8 is a cross section structural diagram of field effect transistors and of the element separating structure. A difference from Embodiment 1 is that HIGFETs 171 and 172 are formed on an InP substrate instead of the GaAs substrate. An LEC substrate in which Fe is doped is used as a semi-insulating InP substrate 101. The thickness of each of the layers which are formed on the semi-insulating InP substrate 101 by the MBE method and the concentration of each of the impurities are as shown in Table 2. In the table, the composition ratio x of In$_x$Ga$_{1-x}$As of each of layers 103, 104, and 106 is 0.53, and the composition ratio y of In$_y$Al$_{1-y}$As of each of layers 120, 121, 122, and 105 is 0.52, and they are lattice-matched with the InP substrate respectively. The heavily doped n type selectively growing layer 160 is formed by InGaAs instead of GaAs and Si is doped in a concentration of 1×10$_{19}$/cm$^3$.

In FIG. 8, numerals 108, and 128 indicate a refractory gate metal, ohmic electrode, and backside substrate electrode respectively.

TABLE 2

| Layer name | Grown film thickness (nm) | Impurity concentration (1/cm$^3$) | Impurity |
| --- | --- | --- | --- |
| Undoped InGaAs layer 106 | 3 | — | — |
| Undoped InAlAs layer 105 | 7 | — | — |
| n type InGaAs active layer 104 | 10 | 4.0 × 10$^{18}$ | Si |
| p type InGaAs layer 103 | 100 | 9.0 × 10$^{16}$ | Be |
| Undoped InAlAs layer 122 | 200 | — | — |
| High resistance InAlAs layer 121 | 100 | 1.0 × 10$^{15}$ | O |
| Undoped InAlAs buffer layer 120 | 300 | — | — |

According to this second embodiment, the low frequency oscillation phenomenon of the HIGFET can be suppressed, and the cut-off frequency and maximum oscillation frequency of the HIGFET can be improved remarkably, and the bandwidth of the integrated circuit can be improved.

Embodiment 3

Figure 9:
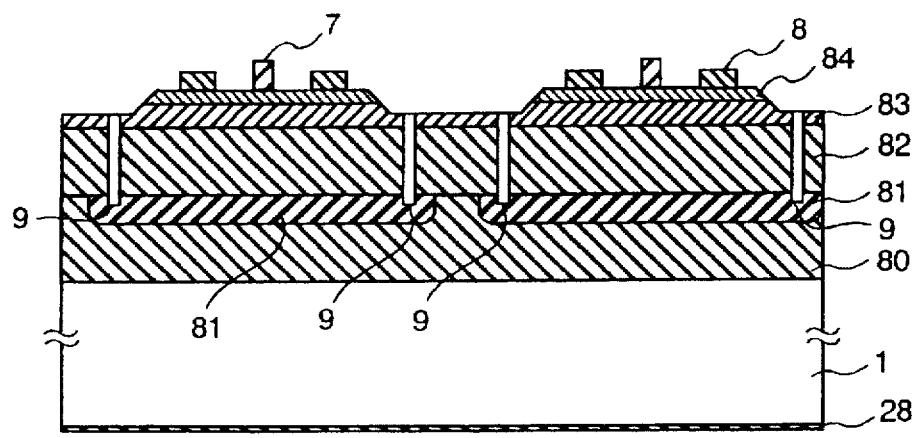
FIG. 9 is a cross sectional view showing the structure of a compound semiconductor integrated circuit of still another embodiment of the present invention.
Figure 10:
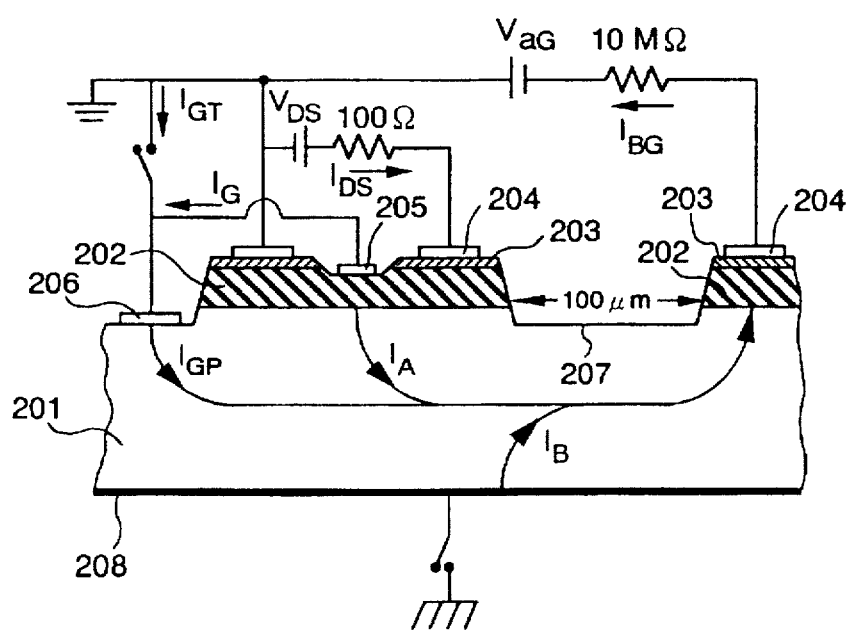
FIG. 10 is a cross sectional view showing the structure of still another compound semiconductor integrated circuit from the prior art.

Next, Embodiment 3 of the present invention will be explained with reference to FIG. 9. FIG. 9 is a cross section structural diagram of field effect transistors and of the element separating structure. Differences from Embodiment 1 are that an O ion implantation layer 81 is formed on an undoped buffer layer 80 instead of the high resistance AlGaAs layer and MESFETs 91 and 92 are formed instead of the HIGFETs. The O ion implantation layer 81 which is a high resistance layer is produced by implanting oxygen ions onto an undoped GaAs buffer layer 80 which is formed on a semi-insulating substrate 1 by the MOCVD method under the condition that the acceleration energy is 100 to 200 keV and the dose is about 1×10$_{12}$/cm$^2$. Thereafter, an undoped GaAs layer 82, a p type GaAs layer 83, and an n type GaAs active layer 84 are formed by the MOCVD method.

According to this third embodiment, the position of the O ion implantation layer 81 which is a high resistance layer can be controlled by using the photolithography and the measure for low frequency oscillation can be selectively applied.

As mentioned above, according to the present invention, the low frequency oscillation in the field effect transistors and integrated circuit thereof can be suppressed and a compound semiconductor integrated circuit which is suited to a superspeed operation can be provided.

In the drawings enumerated above, each same numeral indicates the part which is substantially the same.

What is claimed is:

1. A compound semiconductor integrated circuit comprising:

a semi-insulating substrate;

a high resistance layer having a deep donor level formed by adding an impurity material, said high resistance layer being formed on said semi-insulating substrate;

an undoped semiconductor layer formed over said high resistance layer and a plurality of field effect transistors formed over said undoped layer, said high resistance layer extending under said plurality of field effect transistors, thereby reducing an electric field between said field effect transistors and said semi-insulating substrate and preventing low frequency oscillation.

2. A compound semiconductor integrated circuit according to claim 1, further comprising an undoped buffer layer formed between said semi-insulating substrate and said high resistance layer.

3. A compound semiconductor integrated circuit according to claim 1, further comprising a p type impurity semiconductor layer formed between said undoped semiconductor layer and said field effect transistors.

4. A compound semiconductor integrated circuit according to claim 2, further comprising a p type impurity semiconductor layer formed between said undoped semiconductor layer and said field effect transistors.

5. A compound semiconductor integrated circuit according to claim 1, and further including a backside electrode on a side of said semi-insulating substrate opposite said high resistance layer and wherein when a maximum potential difference between said field effect transistors and said backside electrode of said semi-insulating substrate is set to at least 7 V, a maximum electric field intensity in said semi-insulating substrate is less than 200 V/cm.

6. A compound semiconductor integrated circuit according to claim 2, and further including a backside electrode on a side of said semi-insulating substrate opposite said high resistance layer and wherein when a maximum potential difference between said field effect transistors and said backside electrode of said semi-insulating substrate is set to at least 7 V, a maximum electric field intensity in said semi-insulating substrate is less than 200 V/cm.

7. A compound semiconductor integrated circuit according to claim 1, wherein said semi-insulating substrate consists of GaAs and said material for forming a deep donor level is oxygen.

8. A compound semiconductor integrated circuit according to claim 1, wherein said semi-insulating substrate consists of InP and said material for forming a deep donor level is oxygen.

9. A compound semiconductor integrated circuit according to claim 2, wherein said high resistance layer, to which a material for forming a deep donor level is added as an impurity, is formed by implanting oxygen ions onto said undoped buffer layer.

10. A compound semiconductor integrated circuit comprising:

a semi-insulating substrate composed of GaAs;

an undoped GaAs buffer layer formed on said semi-insulating substrate;

a high resistance layer composed of at least one of GaAs and AlGaAs to which oxygen is added as an impurity for forming a deep donor level, said high resistance layer being formed over said undoped GaAs buffer layer;

an undoped GaAs semiconductor layer formed over said high resistance layer;

a p-type GaAs layer formed over said undoped GaAs semiconductor; and a plurality of field effect transistors having an n-type GaAs layer as active layers which are formed on said p-type GaAs layer, said high resistance layer extending under said plurality of field effect transistors, thereby reducing an electric field between said field effect transistors and said semi-insulating substrate and preventing low frequency oscillation.

11. A compound semiconductor integrated circuit comprising an undoped InAlAs buffer layer, a high resistance layer which consists of InAlAs to which oxygen is added as an impurity for forming a deep donor level, an undoped InAlAs semiconductor layer, a p type InGaAs layer and a plurality of field effect transistors having an n type InGaAs layer as active layers which are formed on a semi-insulating substrate consisting of InP in this order.

12. A compound semiconductor integrated circuit comprising:

a semi-insulating substrate;

a high resistance layer having a deep donor level formed by adding an impurity material, said high resistance layer being formed on said semi-insulating substrate;

an undoped semiconductor layer formed over said high resistance layer; and a plurality of field effect transistors formed over said undoped layer, said high resistance layer extending under said plurality of field effect transistors, thereby reducing an electric field between said field effect transistors and said semi-insulating substrate and preventing low frequency oscillation; and element separating trenches formed in a surface at an opposite side of said semi-insulating substrate of said integrated circuit between said plurality of field effect transistors.

* * * * *

UNITED STATES PATENT AND TRADEMARK OFFICE
CERTIFICATE OF CORRECTION

PATENT NO. : 5,739,559
DATED : April 14, 1998
INVENTOR(S) : Osamu Kagaya et al

It is certified that error appears in the above-identified patent and that said Letters Patent is hereby corrected as shown below:

| Column | Line | |
|---|---|---|
| 2 | 58 | Change "as the" to --as in the--. |
| 3 | 12 | Before "generated" delete "is"; after "generated," change "is" to --are--. |
| 3 | 49 | Change "InGaAs,InAlAs" to --InGaAs, InAlAs,--. |
| 3 | 51 | Change "InAlAs," to --InAlAs,--. |
| 5 | 35 | Change "cannel" to --channel--. |
| 9 | 5 | Change "$1x10_{19}cm^3$" to --$1x10^{19}cm^3$--. |
| 9 | 6 | After "numerals" insert --7,-- |
| 9 | 48 | Change "$1x10_{12}cm^2$" to --$1x10^{12}cm^3$--. |

Signed and Sealed this

Twenty-first Day of March, 2000

Attest:

Q. TODD DICKINSON

*Attesting Officer*   *Commissioner of Patents and Trademarks*